United States Patent
Lee (10) Patent No.: US 10,038,549 B1
(45) Date of Patent: Jul. 31, 2018

(54) CLOCK AND DATA RECOVERY CIRCUIT

(71) Applicant: Shanghai Zhaoxin Semiconductor Co., Ltd., Shanghai (TW)

(72) Inventor: Yeong-Sheng Lee, Fremont, CA (US)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 15/920,992

(22) Filed: Mar. 14, 2018

(51) Int. Cl.
- *H03L 7/087* (2006.01)
- *H04L 7/033* (2006.01)
- *H03K 5/135* (2006.01)
- *H03K 19/20* (2006.01)

(52) U.S. Cl.
CPC ........ *H04L 7/0331* (2013.01); *H03K 5/135* (2013.01); *H03K 19/20* (2013.01)

(58) Field of Classification Search
CPC ....... H04L 7/0331; H04L 7/033; H03K 5/135; H03K 19/20; H03L 7/0891; H03L 7/093
See application file for complete search history.

(56) References Cited

U.S. PATENT DOCUMENTS

| | | | | |
|---|---|---|---|---|
| 6,166,572 A * | 12/2000 | Yamaoka | ................. | H03L 7/07 327/149 |
| 8,279,992 B1 * | 10/2012 | Li | ................. | H04L 7/033 327/157 |
| 9,628,091 B1 * | 4/2017 | Lee | ................. | H03L 7/0807 |
| 2002/0114407 A1 * | 8/2002 | Katzman | ................. | H04L 7/033 375/326 |
| 2005/0110535 A1 * | 5/2005 | Bernstein | ................. | H03L 7/0891 327/156 |
| 2011/0084733 A1 * | 4/2011 | Huang | ................. | H03K 5/023 327/108 |
| 2014/0037035 A1 * | 2/2014 | Chung | ................. | H03K 5/135 375/373 |
| 2014/0286470 A1 * | 9/2014 | Zhou | ................. | H03L 7/087 375/376 |

* cited by examiner

*Primary Examiner* — Syed Haider
(74) *Attorney, Agent, or Firm* — McClure, Qualey & Rodack, LLP (57) ABSTRACT

A CDR (Clock and Data Recovery) circuit includes a current source, an operational amplifier, an NOR gate, and a capacitor. The current source supplies a current to a first node. The operational amplifier has a positive input terminal for receiving a reference voltage, a negative input terminal coupled to the first node, and an output terminal coupled to a second node. The NOR gate has a first input terminal coupled to the second node, a second input terminal coupled to an input node of the CDR circuit, and an output terminal coupled to an output node of the CDR circuit. The input node is arranged for receiving an input signal, and the output node is arranged for outputting an output signal. The capacitor is coupled between the first node and the output node.

10 Claims, 6 Drawing Sheets

FIG. 5

CLOCK AND DATA RECOVERY CIRCUIT

BACKGROUND OF THE INVENTION

Field of the Invention

The disclosure generally relates to a CDR (Clock and Data Recovery) circuit, and more specifically, to a CDR circuit implemented with a simplified circuit structure.

Description of the Related Art

In the field of communications, a receiver requires a CDR (Clock and Data Recovery) circuit to recover received signals. Conventionally, the CDR circuit should include a PLL (Phase Locked Loop) circuit. However, if the frequency of the clock is too high, manufacturing the PLL circuit using a typical CMOS (Complementary Metal Oxide Semiconductor) process will become a critical challenge. The conventional PLL circuit also have a relatively long locking-in time, which degrades the operation speed of the whole system.

Accordingly, there is a need to propose a novel solution for solving the problems of the prior art.

BRIEF SUMMARY OF THE INVENTION

In a preferred embodiment, the invention is directed to a CDR (Clock and Data Recovery) circuit for generating an output signal from an input signal, wherein the output signal is a recovered clock signal corresponding to the input signal, including: a first current source, supplying a first current from a supply voltage to a first node; a first operational amplifier, wherein the first operational amplifier has a positive input terminal for receiving a reference voltage, a negative input terminal coupled to the first node, and an output terminal coupled to a second node; a first NOR gate, wherein the first NOR gate has a first input terminal coupled to the second node, a second input terminal coupled to an input node of the CDR circuit, and an output terminal coupled to an output node of the CDR circuit, wherein the input node is arranged for receiving the input signal, and the output node is arranged for outputting the output signal; and a first capacitor, coupled between the first node and the output node.

In some embodiments, the reference voltage is less than half of the supply voltage.

In some embodiments, the CDR circuit further includes: a second current source, supplying a second current from the supply voltage to a third node; a second operational amplifier, wherein the second operational amplifier has a positive input terminal for receiving the reference voltage, a negative input terminal coupled to the third node, and an output terminal coupled to a fourth node; a second NOR gate, wherein the second NOR gate has a first input terminal coupled to the fourth node, a second input terminal coupled to the output node, and an output terminal coupled to a fifth node; and a second capacitor, coupled between the third node and the fifth node.

In some embodiments, the CDR circuit further includes: a third current source, supplying a third current from the supply voltage to a sixth node; a third operational amplifier, wherein the third operational amplifier has a positive input terminal for receiving the reference voltage, a negative input terminal coupled to the sixth node, and an output terminal coupled to a seventh node; a third NOR gate, wherein the third NOR gate has a first input terminal coupled to the seventh node, a second input terminal coupled to an eighth node, and an output terminal coupled to a ninth node; and a third capacitor, coupled between the sixth node and the ninth node.

In some embodiments, the CDR circuit further includes: a first AND gate, wherein the first AND gate has a first input terminal coupled to the fourth node, a second input terminal coupled to the input node, and an output terminal coupled to the eighth node.

In some embodiments, the CDR circuit further includes: an N-type transistor, wherein the N-type transistor has a control terminal coupled to the ninth node, a first terminal coupled to a ground voltage, and a second terminal coupled to a tenth node; a first P-type transistor, wherein the first P-type transistor has a control terminal coupled to the tenth node, a first terminal coupled to the supply voltage, and a second terminal coupled to the tenth node; a second P-type transistor, wherein the second P-type transistor has a control terminal coupled to the tenth node, a first terminal coupled to the supply voltage, and a second terminal coupled to a reference node, and wherein the reference node is arranged for outputting the reference voltage; and a fourth capacitor, coupled between the reference node and the ground voltage.

In some embodiments, the first current, the second current, and the third current are substantially equal to each other, and the first capacitor, the second capacitor, and the third capacitor are substantially equal to each other.

In some embodiments, the CDR circuit further includes: a data edge generator, generating the input signal according to a plurality of data signals, wherein at each boundary between consecutive data symbol intervals of the plurality of data signals, at least one of the plurality of data signals has a transition.

In some embodiments, the data edge generator includes: a plurality of subtractors, each subtracting one of the plurality of data signals from another one of the plurality of data signals, so as to generate a plurality of difference signals; a plurality of detectors, each detecting rising and falling edges of a corresponding one of the plurality of difference signals, so as to generate a corresponding one of a plurality of detection signals; and a first OR gate, wherein the first OR gate has a plurality of input terminals for respectively receiving the plurality of the detection signals, and an output terminal for outputting the input signal.

In some embodiments, each of the plurality of detectors includes: a first inverter, wherein the first inverter has an input terminal coupled to a detector input node, and an output terminal coupled to an eleventh node, and wherein the detector input node is arranged for receiving the first difference signal, the second difference signal, or the third difference signal; a second AND gate, wherein the second AND gate has a first input terminal coupled to the detector input node, a second input terminal coupled to the eleventh node, and an output terminal coupled to a twelfth node; a second inverter, wherein the second inverter has an input terminal coupled to the detector input node, and an output terminal coupled to a thirteenth node; a fourth NOR gate, wherein the fourth NOR gate has a first input terminal coupled to the detector input node, a second input terminal coupled to the thirteenth node, and an output terminal coupled to a fourteenth node; and a second OR gate, wherein the second OR gate has a first input terminal coupled to the twelfth node, a second input terminal coupled to the fourteenth node, and an output terminal coupled to a detector output node, and wherein the detector output node is arranged for outputting the first detection signal, the second detection signal, or the third detection signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
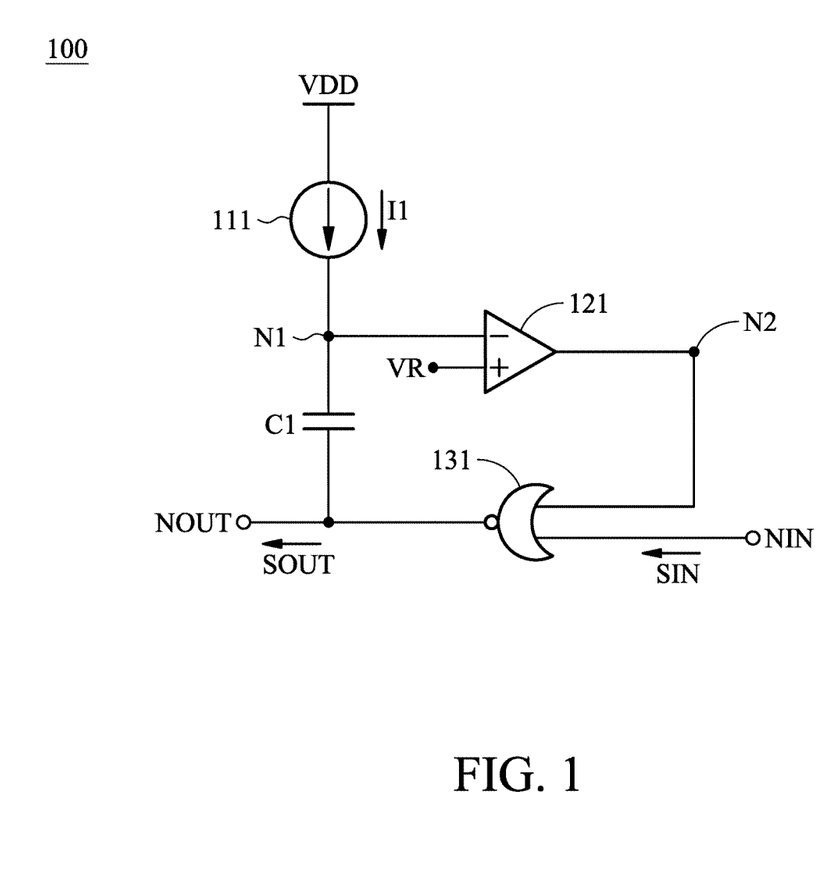
FIG. 1 is a diagram of a CDR (Clock and Data Recovery) circuit according to an embodiment of the invention.

FIG. 1 is a diagram of a CDR (Clock and Data Recovery) circuit 100 according to an embodiment of the invention. In the embodiment of FIG. 1, the CDR circuit 100 at least includes a first current source 111, a first operational amplifier (OP) 121, a first NOR gate 131, and a first capacitor C1. The first current source 111 supplies a first current I1 flowing from a supply voltage VDD to a first node N1. The first operational amplifier 121 has a positive input terminal for receiving a reference voltage VR, a negative input terminal coupled to the first node N1, and an output terminal coupled to a second node N2. For example, the reference voltage VR may be any constant voltage which is lower than a half of the supply voltage VDD $$\left(\text{i.e., } VR < \frac{VDD}{2}\right).$$

The first NOR gate 131 has a first input terminal coupled to the second node N2, a second input terminal coupled to an input node NIN of the CDR circuit 100, and an output terminal coupled to an output node NOUT of the CDR circuit 100. The input node NIN of the CDR circuit 100 is arranged for receiving an input signal SIN. For example, the input signal SIN may be a periodical signal which is determined according to one or a plurality of data signals. The output node NOUT of the CDR circuit 100 is arranged for outputting an output signal SOUT. For example, the output signal SOUT may be a recovered clock signal. The first capacitor C1 is coupled between the first node N1 and the output node NOUT.

In some embodiments, the input signal SIN includes a plurality of pulses (e.g., a pulse may be a very short high-logic interval), and each of the pulses corresponds to a rising and/or falling edge of the data signals. Since each of the pulses of the input signal SIN resets the output signal SOUT to a low logic level (i.e., the logic "0"), the output signal SOUT and the input signal SIN can have the same periodic durations, and the output signal SOUT can be considered as a recovered clock signal based on the input signal SIN, though the duty cycle may not be 50%. In addition, the output signal SOUT may have an exact 50% duty cycle if the first current I1 of the first current source 111, the capacitance of the first capacitor C1, and the voltage level of the reference voltage VR are appropriately designed. It should be noted that the CDR circuit 100 does not include any PLL (Phase Locked Loop) circuit. Therefore, the proposed design of the invention can overcome the problems of the difficult manufacturing process and the long locking-in time relative to the conventional CDR circuit using a PLL circuit.

Figure 2:
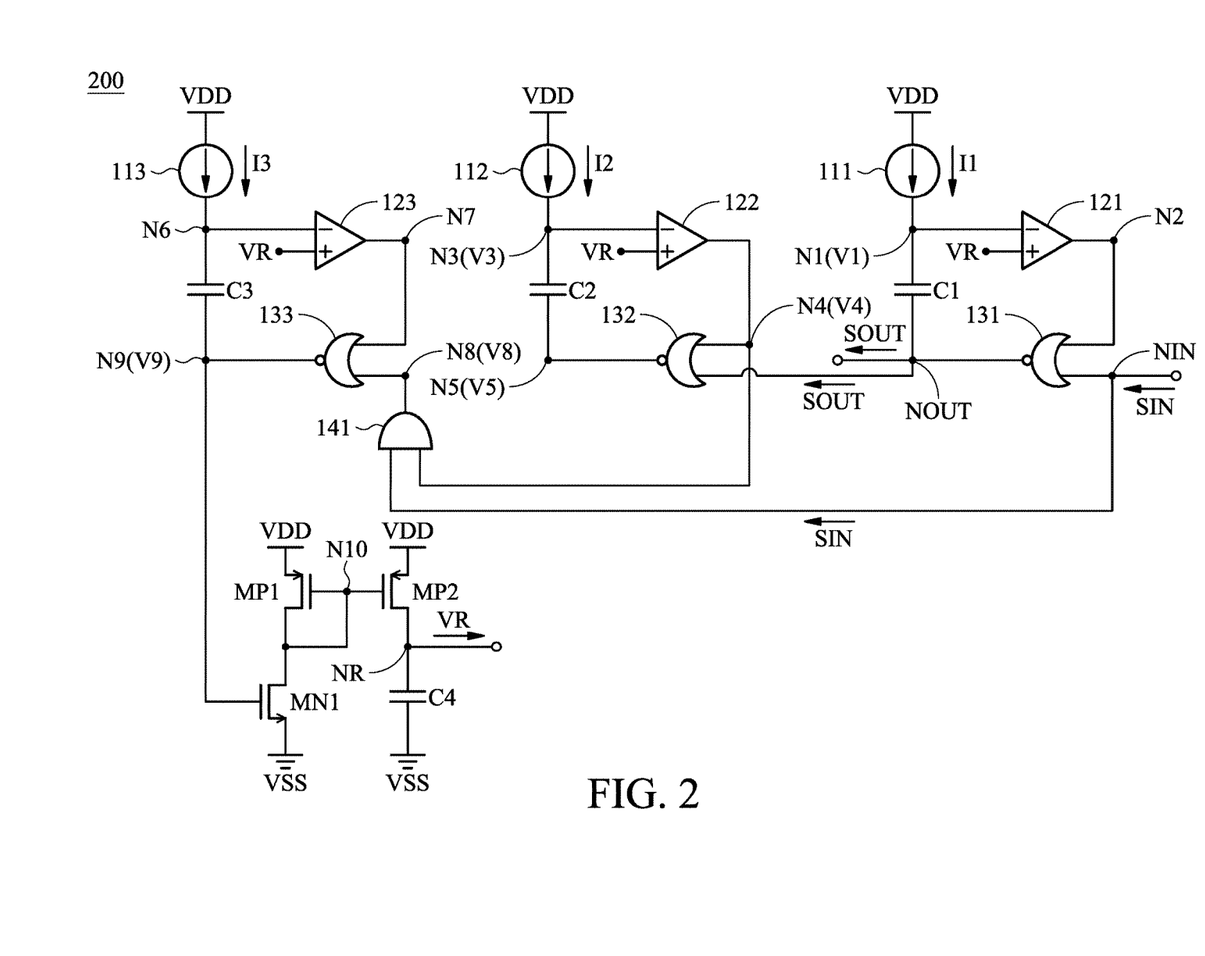
FIG. 2 is a diagram of a CDR circuit according to another embodiment of the invention.

FIG. 2 is a diagram of a CDR (Clock and Data Recovery) circuit 200 according to another embodiment of the invention. FIG. 2 is similar to FIG. 1. In the embodiment of FIG. 2, the CDR circuit 200 includes a first current source 111, a second current source 112, a third current source 113, a first operational amplifier 121, a second operational amplifier 122, a third operational amplifier 123, a first NOR gate 131, a second NOR gate 132, a third NOR gate 133, a first AND gate 141, an N-type transistor MN1, a first P-type transistor MP1, a second P-type transistor MP2, a first capacitor C1, a second capacitor C2, a third capacitor C3, and a fourth capacitor C4. For example, the N-type transistor MN1 may be an NMOS transistor (N-type Metal Oxide Semiconductor Field Effect Transistor), and each of the first P-type transistor MP1 and the second P-type transistor MP2 may be a PMOS transistor (P-type Metal Oxide Semiconductor Field Effect Transistor).

The first current source 111 supplies a first current I1 flowing from a supply voltage VDD to a first node N1. The first operational amplifier 121 has a positive input terminal for receiving a reference voltage VR, a negative input terminal coupled to the first node N1, and an output terminal coupled to a second node N2. For example, the reference voltage VR may be any dynamic voltage whose initial value is lower than a half of the supply voltage VDD, and the voltage level of the reference voltage VR is adjustable according to the input signal SIN. The first NOR gate 131 has a first input terminal coupled to the second node N2, a second input terminal coupled to an input node NIN of the CDR circuit 200, and an output terminal coupled to an output node NOUT of the CDR circuit 200. The input node NIN of the CDR circuit 200 is arranged for receiving an input signal SIN. For example, the input signal SIN may be a periodical signal which is determined according to one or a plurality of data signals. The output node NOUT of the CDR circuit 200 is arranged for outputting an output signal SOUT. For example, the output signal SOUT may be a recovered clock signal based on the input signal SIN. The first capacitor C1 is coupled between the first node N1 and the output node NOUT.

The second current source 112 supplies a second current I2 flowing from the supply voltage VDD to a third node N3. The second operational amplifier 122 has a positive input terminal for receiving the reference voltage VR, a negative input terminal coupled to the third node N3, and an output terminal coupled to a fourth node N4. The second NOR gate 132 has a first input terminal coupled to the fourth node N4, a second input terminal coupled to the output node NOUT for receiving the output signal SOUT, and an output terminal coupled to a fifth node N5. The second capacitor C2 is coupled between the third node N3 and the fifth node N5. The second current I2 may be the same as the first current I1. The capacitance of the second capacitor C2 may be the same as the capacitance of the first capacitor C1.

The third current source 113 supplies a third current I3 flowing from the supply voltage VDD to a sixth node N6. The third operational amplifier 123 has a positive input terminal for receiving the reference voltage VR, a negative input terminal coupled to the sixth node N6, and an output terminal coupled to a seventh node N7. The third NOR gate 133 has a first input terminal coupled to the seventh node N7, a second input terminal coupled to an eighth node N8, and an output terminal coupled to a ninth node N9. The third capacitor C3 is coupled between the sixth node N6 and the ninth node N9. The first AND gate 141 has a first input terminal coupled to the fourth node N4, a second input terminal coupled to the input node NIN for receiving the input signal SIN, and an output terminal coupled to the eighth node N8. The third current I3 may be the same as the first current I1. The capacitance of the third capacitor C3 may be the same as the capacitance of the first capacitor C1.

The N-type transistor MN1 has a control terminal coupled to the ninth node N9, a first terminal coupled to a ground voltage VSS, and a second terminal coupled to a tenth node N10. The first P-type transistor MP1 has a control terminal coupled to the tenth node N10, a first terminal coupled to the supply voltage VDD, and a second terminal coupled to the tenth node N10. The second P-type transistor MP2 has a control terminal coupled to the tenth node N10, a first terminal coupled to the supply voltage VDD, and a second terminal coupled to a reference node NR. The reference node NR is arranged for outputting the reference voltage VR. The fourth capacitor C4 is coupled between the reference node NR and the ground voltage VSS.

In the embodiment of FIG. 2, the reference voltage VR has a dynamic value, and the CDR circuit 200 can automatically adjust the output signal SOUT, such that the duty cycle of the output signal SOUT finally reaches 50%. Specifically, a current mirror is formed by the first P-type transistor MP1 and the second P-type transistor MP2, and it dynamically adjusts the voltage level of the reference voltage VR, which affects the duty cycle of the output signal SOUT. When the reference voltage VR finally reaches a constant value, an adjustment process for the output signal SOUT is finished. Finally, the CDR circuit 200 not only provides the output signal SOUT having the same periodic duration as that of the input signal SIN, but also makes the duty cycle of the output signal SOUT equal to exact 50%. Please refer to the following embodiments to understand the operation theory of the CDR circuit 200.

Figure 3A:
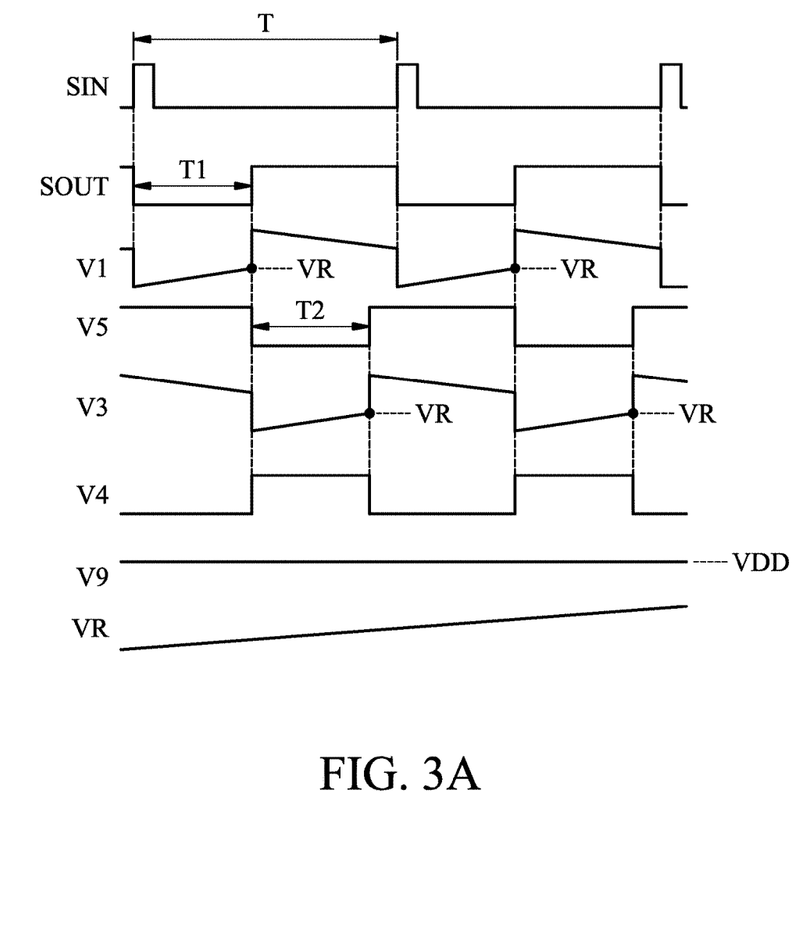
FIG. 3A is a diagram of waveforms of a CDR circuit operating in an initial state according to an embodiment of the invention.

FIG. 3A is a diagram of waveforms of the CDR circuit 200 operating in an initial state according to an embodiment of the invention. The horizontal axis represents the time, and the vertical axis represents the voltage level of each signal. As shown in FIG. 3A, a voltage V1 at the first node N1, a voltage V3 at the third node N3, a voltage V4 at the fourth node N4, a voltage V5 at the fifth node N5, and a voltage V9 at the ninth node N9 are also introduced for the reader to easily understand the invention. The input signal SIN is a periodical signal having a periodic duration T, and it includes a plurality of pulses. The periodic duration T may be defined as the interval between two rising edges of any two adjacent pulses. Since each of the pulses of the input signal SIN resets the output signal SOUT to a low logic level (i.e., the logic "0"), the output signal SOUT and the input signal SIN can have the same periodic durations T. When a pulse of the input signal SIN pulls down the output signal SOUT, the voltage V1 at the first node N1 also falls to a low logic level due to the first capacitor C1 maintaining a constant voltage difference between the first node N1 and the output node NOUT. Next, the voltage level of the voltage V1 at the first node N1 is gradually charged up by the first current source 111. If the voltage V1 becomes higher and reaches the reference voltage VR, the output voltage level of the first operational amplifier 121 (i.e., the voltage at the second node N2) can be inverted (becomes a low logic level). At this time, the voltage at the first input terminal and the voltage at the second input terminal of the first NOR gate 131 are both at a low logic level, thus the output signal SOUT rises to a high logic level (i.e., the logic "1") and also pushes up the voltage V1. The low logic duration T1 of the output signal SOUT may be calculated according to the equation (1).

$$T1 = \frac{C1 \cdot VR}{I1} \quad (1)$$

where "T1" represents the low logic duration T1 of the output signal SOUT, "C1" represents the capacitance of the first capacitor C1, "VR" represents the voltage level of the reference voltage VR, and "I1" represents the current magnitude of the first current I1.

Similarly, the high logic duration of the output signal SOUT resets the voltage V5 at the fifth node N5 to a low logic level. The low logic duration T2 of the voltage V5 may be calculated according to the equation (2).

$$T2 = \frac{C2 \cdot VR}{I2} \quad (2)$$

where "T2" represents the low logic duration T2 of the voltage V5, "C2" represents the capacitance of the second capacitor C2, "VR" represents the voltage level of the reference voltage VR, and "I2" represents the current magnitude of the first current I2.

In some embodiments, the first current I1, the second current I2, and the third current I3 are substantially equal to each other, and the capacitance of the first capacitor C1, the capacitance of the second capacitor C2, and the capacitance of the third capacitor C3 are substantially equal to each other. Accordingly, the low logic duration T2 of the voltage V5 may be equal to the low logic duration T1 of the output signal SOUT, and their relationship may be calculated according to the equations (3) and (4).

$$T2=T1 \quad (3)$$

$$T1+T2<T \quad (4)$$

where "T1" represents the low logic duration T1 of the output signal SOUT, "T2" represents the low logic duration T2 of the voltage V5, and "T" represents the periodic duration T of the input signal SIN.

That is, initially, the sum of the low logic durations T1 and T2 is shorter than the periodic duration T of the input signal SIN, and it means that the initial output signal SOUT does not have a 50% duty cycle (i.e., larger than 50%). The first AND gate 141 and the third NOR gate 133 are configured to monitor the voltage V4 at the fourth node N4 and the voltage level of the input signal SIN, which are related to the low logic durations T1 and T2. In the initial state, the voltage V8 at the output terminal of the first AND gate 141 is maintained at a low logic level, and the voltage V9 at the output terminal of the third NOR gate 133 is maintained at a high logic level (e.g., the supply voltage VDD). Therefore, the current mirror formed by the first P-type transistor MP1 and the second P-type transistor MP2 is enabled, so as to continuously pull up the voltage level of the reference voltage VR by charging the fourth capacitor C4. According to the equations (1) and (2), both the low logic durations T1 and T2 are proportional to the reference voltage VR, so that they continuously become longer.

Figure 3B:
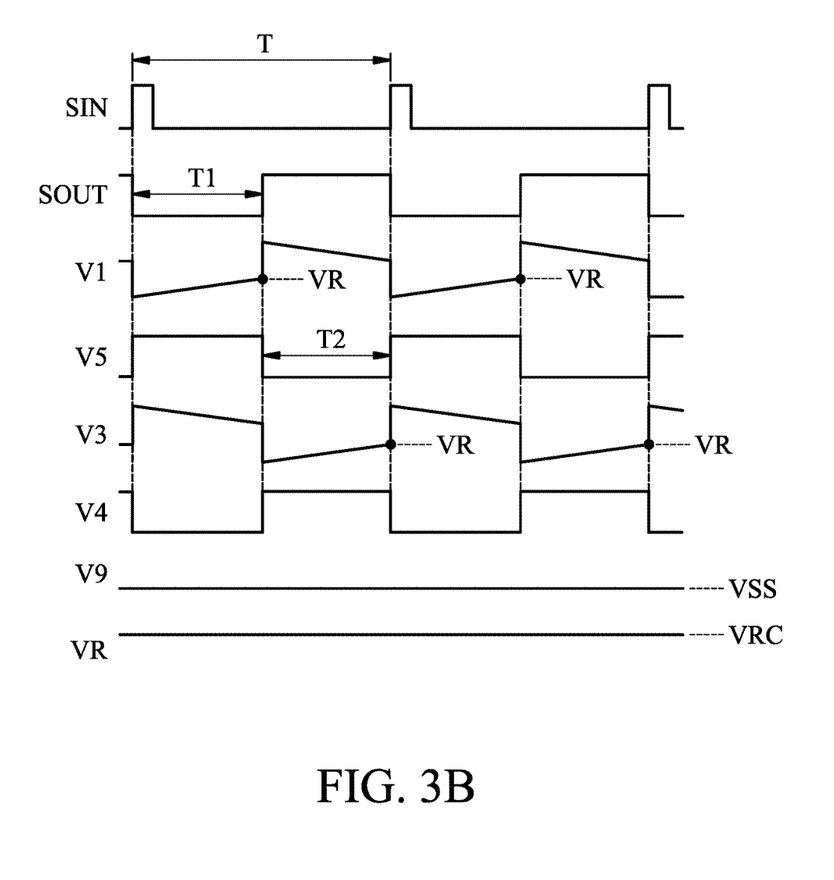
FIG. 3B is a diagram of waveforms of a CDR circuit operating in a steady state according to an embodiment of the invention.

FIG. 3B is a diagram of waveforms of the CDR circuit 200 operating in a steady state according to an embodiment of the invention. The horizontal axis represents the time, and the vertical axis represents the voltage level of each signal. After a calibration process is performed by the CDR circuit 200, the relationship between the aforementioned signals and voltages may be calculated according to the equation (5).

$$T1 = T2 = \frac{T}{2} \quad (5)$$

where "T1" represents the low logic duration T1 of the output signal SOUT, "T2" represents the low logic duration T2 of the voltage V5, and "T" represents the periodic duration T of the input signal SIN.

That is, eventually, each of the low logic durations T1 and T2 becomes substantially equal to a half of the periodic duration T of the input signal SIN, and it means that the final output signal SOUT exactly has a 50% duty cycle. Specifically, if the sum of the low logic durations T1 and T2 becomes slightly longer than the periodic duration T, the voltage V8 at the output terminal of the first AND gate 141 will generate a very short high logic pulse, so as to pull down the voltage V9 at the output terminal of the third NOR gate 133 to the ground voltage VSS. Therefore, the current mirror formed by the first P-type transistor MP1 and the second P-type transistor MP2 is disabled, and the reference voltage VR is maintained at a constant voltage level VRC corresponding to a 50% duty cycle, which means that the adjustment process is finished.

Figure 4:
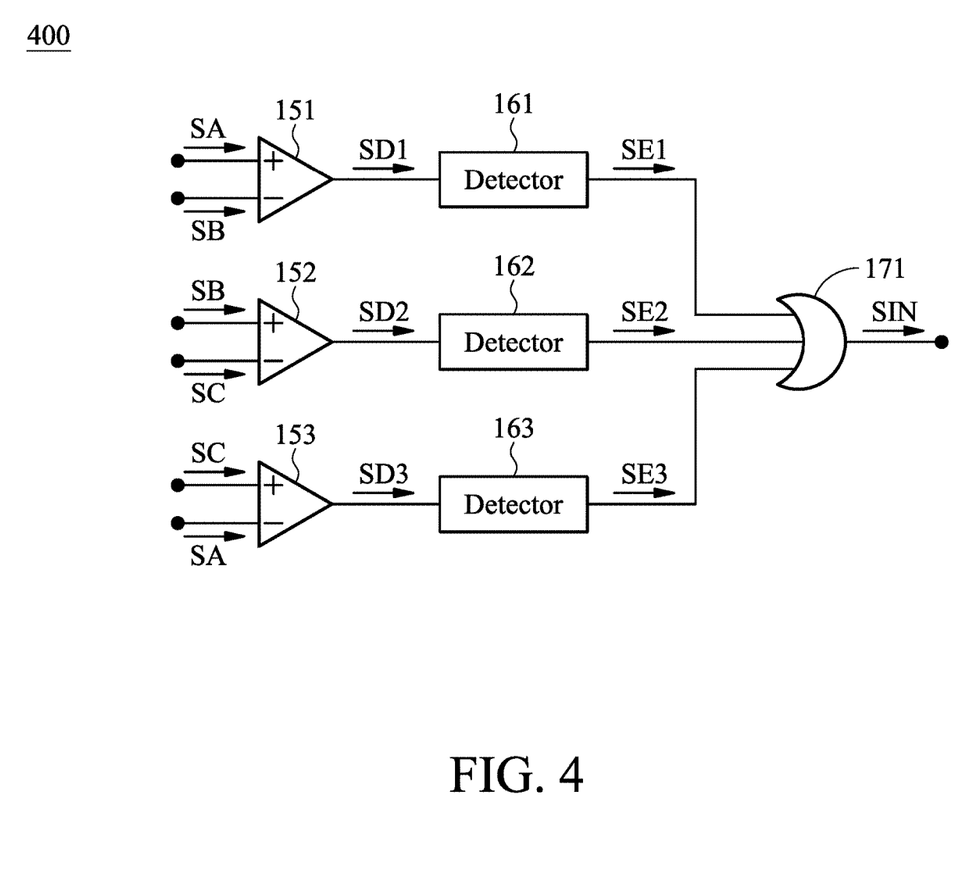
FIG. 4 is a diagram of a data edge generator according to an embodiment of the invention.

FIG. 4 is a diagram of a data edge generator 400 according to an embodiment of the invention. In the embodiment of FIG. 4, the CDR circuit 100 or 200 further includes the data edge generator 400 for generating the input signal SIN according to a first data signal SA, a second data signal SB, and a third data signal SC. The data edge generator 400 includes a first subtractor 151, a second subtractor 152, a third subtractor 153, a first detector 161, a second detector 162, a third detector 163, and a first OR gate 171. The first subtractor 151 subtracts the second data signal SB from the first data signal SA, so as to generate a first difference signal SD1. The second subtractor 152 subtracts the third data signal SC from the second data signal SB, so as to generate a second difference signal SD2. The third subtractor 153 subtracts the first data signal SA from the third data signal SC, so as to generate a third difference signal SD3. The relationship between the aforementioned signals may be calculated according to the equations (6), (7), and (8).

$$SD1 = SA - SB \quad (6)$$

$$SD2 = SB - SC \quad (7)$$

$$SD3 = SC - SA \quad (8)$$

where "SD1" represents the voltage level of the first difference signal SD1, "SD2" represents the voltage level of the second difference signal SD2, "SD3" represents the voltage level of the third difference signal SD3, "SA" represents the voltage level of the first data signal SA, "SB" represents the voltage level of the second data signal SB, and "SC" represents the voltage level of the third data signal SC. In one embodiment, the first subtractor 151, the second subtractor 152, and the third subtractor 153 may all be differential amplifiers well known to those skilled in the art. In one embodiment, at each boundary between consecutive symbol intervals, at least one of the first data signal SA, the second data signal SB, and the third data signal SC has a transition, so that a corresponding clock signal may be recovered according to the three data signals.

The first detector 161 detects rising and falling edges of the first difference signal SD1, so as to generate a first detection signal SE1. The second detector 162 detects rising and falling edges of the second difference signal SD2, so as to generate a second detection signal SE2. The third detector 163 detects rising and falling edges of the third difference signal SD3, so as to generate a third detection signal SE3. The first OR gate 171 has a first input terminal for receiving the first detection signal SE1, a second input terminal for receiving the second detection signal SE2, a third input terminal for receiving the third detection signal SE3, and an output terminal for outputting the input signal SIN. With such a design, the data edge generator 400 can generate the periodical input signal SIN including a plurality of pulses, and each of the pulses of the input signal SIN corresponds to a level switching operation between the first data signal SA, the second data signal SB, and the third data signal SC. It should be understood that the number of data signals input to the data edge generator 400 is not limited in the invention although there are exactly three data signals display in FIG. 4. In alternative embodiments, the data edge generator 400 can include more or fewer subtractors and detectors for processing more or fewer data signals so as to generate the input signal SIN, without affecting the performance of the invention. In general, the data edge generator 400 may include a plurality of subtractors, each subtracting one of a plurality of data signals from another one of the plurality of data signals, so as to generate a plurality of difference signals; a plurality of detectors, each detecting rising and falling edges of a corresponding one of the plurality of difference signals, so as to generate a corresponding one of a plurality of detection signals; and a first OR gate, wherein the first OR gate has a plurality of input terminals, each receiving a corresponding one of the plurality of the detection signals, and an output terminal for outputting the input signal.

Figure 5:
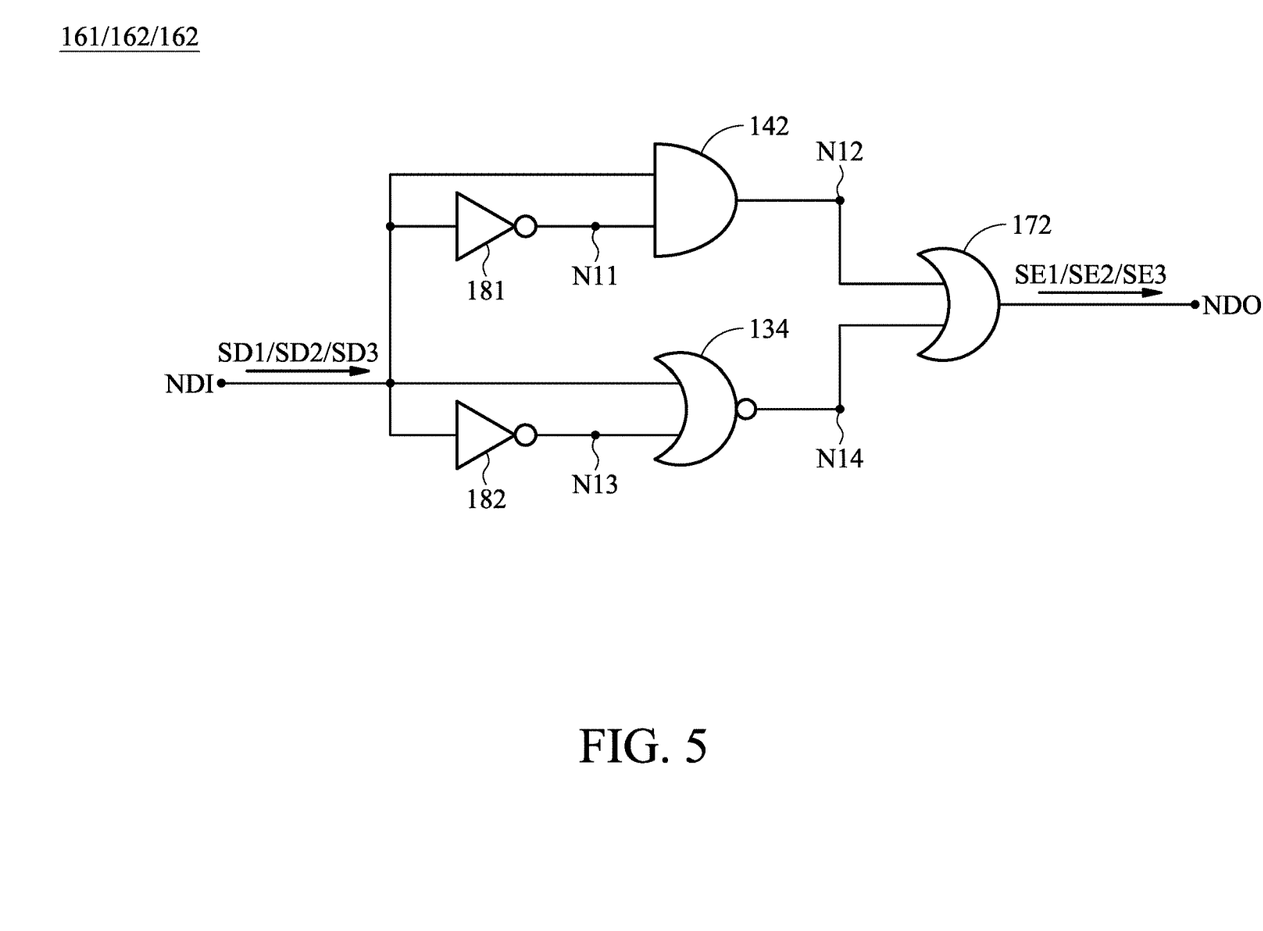
FIG. 5 is a diagram of a detector according to an embodiment of the invention.

FIG. 5 is a diagram of each of the first detector 161, the second detector 162, and the third detector 163 according to an embodiment of the invention. In the embodiment of FIG.

5, each of the first detector 161, the second detector 162, and the third detector 163 has a detector input node NDI and a detector output node NDO, and includes a first inverter 181, a second inverter 182, a second AND gate 142, a fourth NOR gate 134, and a second OR gate 172. The first inverter 181 has an input terminal coupled to the detector input node NDI, and an output terminal coupled to an eleventh node N11. For the first detector 161, the detector input node NDI is arranged for receiving the first difference signal SD1; for the second detector 162, the detector input node NDI is arranged for receiving the second difference signal SD2; for the third detector 163, the detector input node NDI is arranged for receiving the third difference signal SD3. The second AND gate 142 has a first input terminal coupled to the detector input node NDI, a second input terminal coupled to the eleventh node N11, and an output terminal coupled to a twelfth node N12. The second inverter 182 has an input terminal coupled to the detector input node NDI, and an output terminal coupled to a thirteenth node N13. The fourth NOR gate 134 has a first input terminal coupled to the detector input node NDI, a second input terminal coupled to the thirteenth node N13, and an output terminal coupled to a fourteenth node N14. The second OR gate 172 has a first input terminal coupled to the twelfth node N12, a second input terminal coupled to the fourteenth node N14, and an output terminal coupled to the detector output node NDO. For the first detector 161, the detector output node NDO is arranged for outputting the first detection signal SE1; for the second detector 162, the detector output node NDO is arranged for outputting the second detection signal SE2; for the third detector 163, the detector output node NDO is arranged for outputting the third detection signal SE3.

The invention provides a novel CDR circuit implemented with a simplified circuit structure. In conclusion, the proposed design has at least the following advantages over the prior art: (1) removing the conventional PLL circuit, (2) eliminating the long locking-in time of the conventional PLL circuit, (3) being easily manufactured by a typical CMOS process, (4) reducing the total manufacturing cost, and (5) being more insensitive to PVT (Process, Voltage, and Temperature) variations. According to simulation, the frequency of the output signal using the proposed CDR circuit can be significantly improved to 2.5 GHz, 5 GHz or higher. Therefore, the invention is suitable for application in a variety of circuit designs, such as a high speed portable LED (Light-Emitting Diode) display or a new MIPI (Mobile Industry Processor Interface) standard, but it is not limited thereto.

Note that the above voltages, currents, resistances, inductances, capacitances and other element parameters are not limitations of the invention. A designer can adjust these parameters according to different requirements. The CDR circuit of the invention is not limited to the configurations of FIGS. 1-5. The invention may merely include any one or more features of any one or more embodiments of FIGS. 1-5. In other words, not all of the features displayed in the figures should be implemented in the CDR circuit of the invention. Although the embodiments of the invention use MOSFET (Metal Oxide Semiconductor Field Effect Transistor) as examples, the invention is not limited thereto, and those skilled in the art may use other types of transistors such as BJT (Bipolar Junction Transistor), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. A CDR (Clock and Data Recovery) circuit for generating an output signal from an input signal, wherein the output signal is a recovered clock signal corresponding to the input signal, comprising:
    a first current source, supplying a first current from a supply voltage to a first node;
    a first operational amplifier, wherein the first operational amplifier has a positive input terminal for receiving a reference voltage, a negative input terminal coupled to the first node, and an output terminal coupled to a second node;
    a first NOR gate, wherein the first NOR gate has a first input terminal coupled to the second node, a second input terminal coupled to an input node of the CDR circuit, and an output terminal coupled to an output node of the CDR circuit, wherein the input node is arranged for receiving the input signal, and the output node is arranged for outputting the output signal; and
    a first capacitor, coupled between the first node and the output node.

2. The CDR circuit as claimed in claim 1, wherein the reference voltage is less than half of the supply voltage.

3. The CDR circuit as claimed in claim 1, further comprising:
    a second current source, supplying a second current from the supply voltage to a third node;
    a second operational amplifier, wherein the second operational amplifier has a positive input terminal for receiving the reference voltage, a negative input terminal coupled to the third node, and an output terminal coupled to a fourth node;
    a second NOR gate, wherein the second NOR gate has a first input terminal coupled to the fourth node, a second input terminal coupled to the output node, and an output terminal coupled to a fifth node; and
    a second capacitor, coupled between the third node and the fifth node.

4. The CDR circuit as claimed in claim 3, further comprising:
    a third current source, supplying a third current from the supply voltage to a sixth node;
    a third operational amplifier, wherein the third operational amplifier has a positive input terminal for receiving the reference voltage, a negative input terminal coupled to the sixth node, and an output terminal coupled to a seventh node;
    a third NOR gate, wherein the third NOR gate has a first input terminal coupled to the seventh node, a second input terminal coupled to an eighth node, and an output terminal coupled to a ninth node; and
    a third capacitor, coupled between the sixth node and the ninth node.

5. The CDR circuit as claimed in claim 4, further comprising:

a first AND gate, wherein the first AND gate has a first input terminal coupled to the fourth node, a second input terminal coupled to the input node, and an output terminal coupled to the eighth node.

6. The CDR circuit as claimed in claim 5, further comprising:
   an N-type transistor, wherein the N-type transistor has a control terminal coupled to the ninth node, a first terminal coupled to a ground voltage, and a second terminal coupled to a tenth node;
   a first P-type transistor, wherein the first P-type transistor has a control terminal coupled to the tenth node, a first terminal coupled to the supply voltage, and a second terminal coupled to the tenth node;
   a second P-type transistor, wherein the second P-type transistor has a control terminal coupled to the tenth node, a first terminal coupled to the supply voltage, and a second terminal coupled to a reference node, and wherein the reference node is arranged for outputting the reference voltage; and
   a fourth capacitor, coupled between the reference node and the ground voltage.

7. The CDR circuit as claimed in claim 6, wherein the first current, the second current, and the third current are substantially equal to each other, and the first capacitor, the second capacitor, and the third capacitor are substantially equal to each other.

8. The CDR circuit as claimed in claim 1, further comprising:
   a data edge generator, generating the input signal according to a plurality of data signals, wherein at each boundary between consecutive data symbol intervals of the plurality of data signals, at least one of the plurality of data signals has a transition.

9. The CDR circuit as claimed in claim 8, wherein the data edge generator comprises:
   a plurality of subtractors, each subtracting one of the plurality of data signals from another one of the plurality of data signals, so as to generate a plurality of difference signals;
   a plurality of detectors, each detecting rising and falling edges of a corresponding one of the plurality of difference signals, so as to generate a corresponding one of a plurality of detection signals; and
   a first OR gate, wherein the first OR gate has a plurality of input terminals for respectively receiving the plurality of detection signals, and an output terminal for outputting the input signal.

10. The CDR circuit as claimed in claim 9, wherein each of the plurality of detectors comprises:
    a first inverter, wherein the first inverter has an input terminal coupled to a detector input node, and an output terminal coupled to an eleventh node, and wherein the detector input node is arranged for receiving the first difference signal, the second difference signal, or the third difference signal;
    a second AND gate, wherein the second AND gate has a first input terminal coupled to the detector input node, a second input terminal coupled to the eleventh node, and an output terminal coupled to a twelfth node;
    a second inverter, wherein the second inverter has an input terminal coupled to the detector input node, and an output terminal coupled to a thirteenth node;
    a fourth NOR gate, wherein the fourth NOR gate has a first input terminal coupled to the detector input node, a second input terminal coupled to the thirteenth node, and an output terminal coupled to a fourteenth node; and
    a second OR gate, wherein the second OR gate has a first input terminal coupled to the twelfth node, a second input terminal coupled to the fourteenth node, and an output terminal coupled to a detector output node, and wherein the detector output node is arranged for outputting the first detection signal, the second detection signal, or the third detection signal.

* * * * *

UNITED STATES PATENT AND TRADEMARK OFFICE
CERTIFICATE OF CORRECTION

PATENT NO. : 10,038,549 B1
APPLICATION NO. : 15/920992
DATED : July 31, 2018
INVENTOR(S) : Yeong-Sheng Lee

Page 1 of 1

It is certified that error appears in the above-identified patent and that said Letters Patent is hereby corrected as shown below:

On the Title Page

In item (71) for the Applicant, immediately following "Shanghai", please delete "(TW)" and insert therefore --(CN)--

Signed and Sealed this
Twenty-ninth Day of January, 2019

Andrei Iancu
*Director of the United States Patent and Trademark Office*